United States Patent
Huang

(10) Patent No.: US 6,221,790 B1
(45) Date of Patent: Apr. 24, 2001

(54) STABLE THIN FILM OXIDE STANDARD

(75) Inventor: Chin-Te Huang, Chia-Yi (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/195,652

(22) Filed: Nov. 19, 1998

(51) Int. Cl.⁷ .................. H01L 21/31; H01L 21/469
(52) U.S. Cl. .................. 438/770; 438/774; 438/791; 438/906
(58) Field of Search ............................ 438/769, 770, 438/787, 791, 774, 906

(56) References Cited

U.S. PATENT DOCUMENTS

| | | | |
|---|---|---|---|
| 4,395,438 | * 7/1983 | Chiang | 427/94 |
| 4,717,446 | * 1/1988 | Nagy et al. | 156/626 |
| 5,132,244 | * 7/1992 | Roy | 437/13 |
| 5,352,636 | * 10/1994 | Beinglass | 437/235 |
| 5,354,575 | 10/1994 | Dagenais et al. | 427/10 |
| 5,506,178 | * 4/1996 | Suzuki et al. | 437/239 |
| 5,751,582 | 5/1998 | Saxena et al. | 364/468.16 |

* cited by examiner

Primary Examiner—John F. Niebling
Assistant Examiner—Alexander G. Ghyka
(74) Attorney, Agent, or Firm—George O. Saile; Stephen B. Ackerman

(57) ABSTRACT

A stable silicon oxide film for use as a thickness reference is prepared by oxidizing a silicon wafer, having a smooth surface, under carefully controlled conditions thereby growing a film of known thickness and refractive index. This is followed by the deposition of a layer of silicon nitride over said oxide film. The resulting structure may then be used as a reference standard when ellipsometry is routinely employed for measuring the thickness of, for example, gate oxides in field effect devices. It has been found that the thickness of the reference layer remains stable over extended time periods without the need for frequent cleaning.

8 Claims, 3 Drawing Sheets

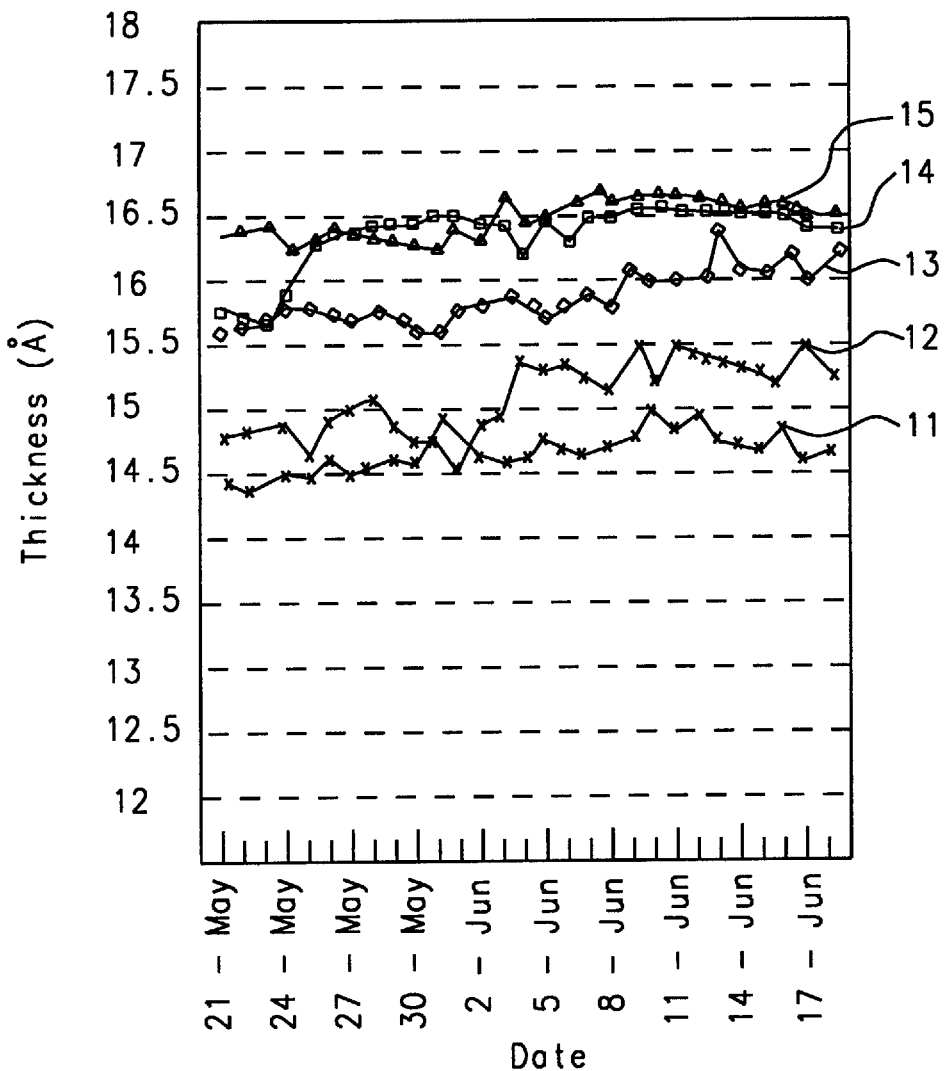
FIG. 1 — Prior Art
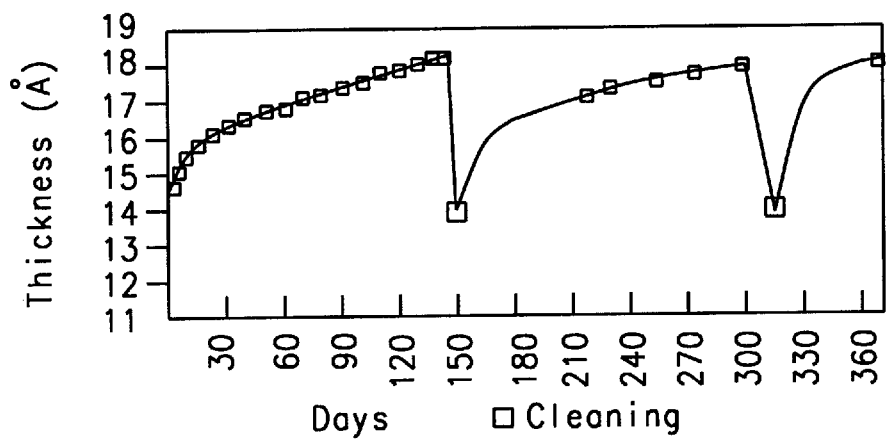
FIG. 2 — Prior Art

STABLE THIN FILM OXIDE STANDARD

FIELD OF THE INVENTION

The invention relates to the general field of integrated circuit manufacture with particular reference to control of gate oxide thickness through ellipsometry.

BACKGROUND OF THE INVENTION

The dimensions within silicon integrated circuits, particularly field effect devices, continue to grow smaller. One of these dimensions is the thickness of the gate oxide layer. For acceptable yield of devices during manufacturing this thickness needs to be controlled to better than about 10%. In TABLE I below we have summarized the required thickness (and acceptable deviations therefrom) as a function of the critical dimension of the devices as well as the voltage that will be applied across these oxide thicknesses.

TABLE I

| thickness/voltage | 5V | 3.3V | 2.5V | ??V |
|---|---|---|---|---|
| 0.6 μm | 125 ± 10Å | | | |
| 0.5 μm | 115 ± 10Å | 85 ± 10Å | | |
| 0.35 μm | 110 ± 10Å | 70 ± 10Å | | |
| 0.25 μm | | | 48 ± 3Å | |
| 0.18 μm | | | | 25–40 ± ?Å |

As can be seen, gate oxide thicknesses less than 50 Angstroms will be required in the near future with control of these thicknesses to better than about three Angstroms. The thickness of transparent films in this range is most easily measured by means of ellipsometry. Ellipsometry is based on measuring changes in the state of polarization of light reflected from a substrate. The state of polarization is determined by the relative amplitude of the parallel and perpendicular components of the radiation as well as the phase difference between them. On reflection from a surface, whether it is bare or covered by a transparent film, the ratio of the amplitudes and phase differences undergo changes that are dependent upon the optical constants of the substrate, the angle of incidence, the optical constants of the film, and the film thickness. Thus, if all the other relevant quantities are known, the thickness can be determined to a high level of accuracy from such measurements When a large number of measurements of layers of the same material, having about the same thickness, are to be made, as in a production environment, calculating each thickness value from scratch can be very time consuming. It is usually more convenient to make measurements that relate to a standard film whose thickness as well as its refractive index is accurately known. While such reference standards are widely used, it has been found that over an extended period standards of this type tend to drift in terms of their thickness value. In addition to a steady thickness growth of about 0.2 Angstroms per day, it is also found that the thickness value fluctuates on a day-to-day basis in an unpredictable manner.

In FIG. 1 we show a plot of thickness as a function of time over a period of approximately one month for several wafers that were used as thickness standards of the prior art design. The measured standard deviations for these curves are shown in TABLE II below:

TABLE II

| CURVE # | Standard Deviation |
|---|---|
| 11 | 0.1579 |
| 12 | 0.2961 |
| 13 | 0.1698 |
| 14 | 0.2855 |
| 15 | 0.2056 |

It has been suggested (by the Rudolph Corp., a manufacturer of ellipsometric equipment) that the changes in measured thickness are mainly due to contamination of the exposed surface (as opposed to continued growth of the oxide proper). They confirm this by their finding that careful cleaning of a wafer standard whose thickness value has drifted returns the thickness once again to its original value. This is illustrated in FIG. 2 where a film standard whose value drifted gradually from about 14.5 Angstroms to about 18 Angstroms over a period of about 180 days was restored to its original value by washing in hydrogen peroxide. At the end of an additional 130 days the thickness value had drifted once again but, as before, could be restored to its original value by using the same cleaning procedure.

While the cleaning procedure described by the Rudolph Corp. clearly works, in a manufacturing environment, the standard wafers would need to be cleaned on a daily basis and possibly even several times a day. Such a procedure is time-consuming with the potential of holding up the production line. Therefore a thickness standard that is stable and does not require regular cleaning is to be preferred. The present invention discloses how such a standard may be formed.

No prior art anticipating the present invention was discovered during our routine search. However, several references of interest were found. Dagenais et al. (U.S. Pat. No. 5,354,575) teach the use of ellipsometry for measurement of anti-reflection coatings used in laser amplifiers but do not discuss the issue of providing a stable standard. Nagy et al. (U.S. Pat. No. 4,717,446) teach a method to measure a film thickness using a monitor wafer while Saxona et al. (U.S. Pat. No. 5,751,582) show a site model and monitor wafer controller for an oxidation process.

SUMMARY OF THE INVENTION

It has been an object of the present invention to provide a stable thin film reference standard for use during ellipsometric measurements in a production environment.

Another object of the invention has been to provide a process for manufacturing said reference standard.

These objects have been achieved by oxidizing a silicon wafer, having a smooth surface, under carefully controlled conditions thereby growing a film of known thickness and refractive index. This is followed by the deposition of a layer of silicon nitride over said oxide film. The resulting structure may then be used as a reference standard when ellipsometry is routinely employed for measuring the thickness of, for example, gate oxides in field effect devices. We have found that the thickness of the reference layer remains stable over extended time periods without the need for frequent cleaning.

BRIEF DESCRIPTION OF THE DRAWINGS

FIG. 1 is a plot showing the variation in the thickness of a series of reference wafers prepared according to the prior art.

FIG. 2 shows how the original thickness can be restored by periodically cleaning the reference layer, as taught in the prior art.

DESCRIPTION OF THE PREFERRED EMBODIMENTS

The present invention is based on the observation that ellipsometric thickness measurements of a thin film can still be made even if that film is covered by another (transparent) film. Reflections from the topmost surface can be readily distinguished from reflections coming from the interface between the two films because the refractive index of the oxide film is 0.46 whereas for the nitride film that is used for the upper film it is 2.0.

As discussed above, it is not practical to perform detailed ellipsometric measurements in a production environment each time that a film thickness needs to be measured. Instead, a standard wafer having a layer of oxide of known thickness and refractive index is used.

Figure 3:
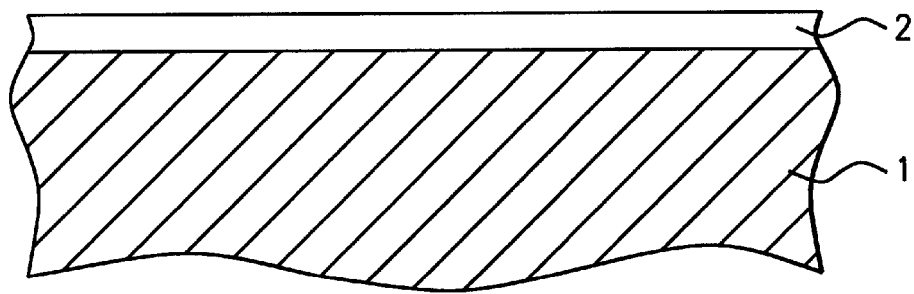
FIGS. 3 and 4 show successive steps in the manufacture of a reference wafer according to the process of the present invention.

We begin a description of the process for manufacturing the film thickness standard disclosed by the present invention by referring to FIG. 3. Silicon wafer 1 is shown and on its surface is oxide layer 2 which will be used as the reference layer. Prior to the formation of layer 2, wafer 1 is carefully polished to ensure a smooth upper surface. In general, for reliable results, this surface will have a micro-roughness that is less than about 2 Angstroms. This surface is then carefully cleaned, the final step of cleaning being performed under vacuum, thereby guaranteeing that the surface is contamination free.

Figure 4:
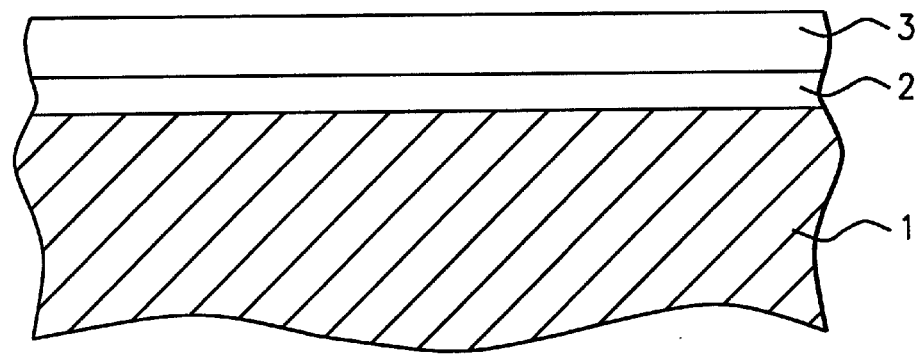

After transfer to a furnace, the surface of wafer 1 is now carefully oxidized to form layer 2. The conditions under which oxidation occurs are wet oxidation at a temperature between about 750 and 850° C., with 800° C. being preferred, for between about 7 to 9 minutes, with 8 minutes being preferred, which results in an oxide between about 25 and 30 Angstroms thick. Once oxide layer 2 has been formed to this thickness (between about 25 and 30 Angstroms and with a refractive index between about 1.460 and 1.466), layer 3 of silicon nitride is deposited as shown in FIG. 4. The vacuum is maintained between the formation of oxide layer 2 and the deposition of silicon nitride 3.

The silicon nitride is grown from a mixture of dichlorosilane and ammonia at a temperature between about 600 and 700° C., with 650° C. being preferred, for between about 35 and 45 minutes, with 40 minutes being preferred. The thickness of the silicon nitride layer 3 is between about 50 and 55 Angstroms.

Figure 5:
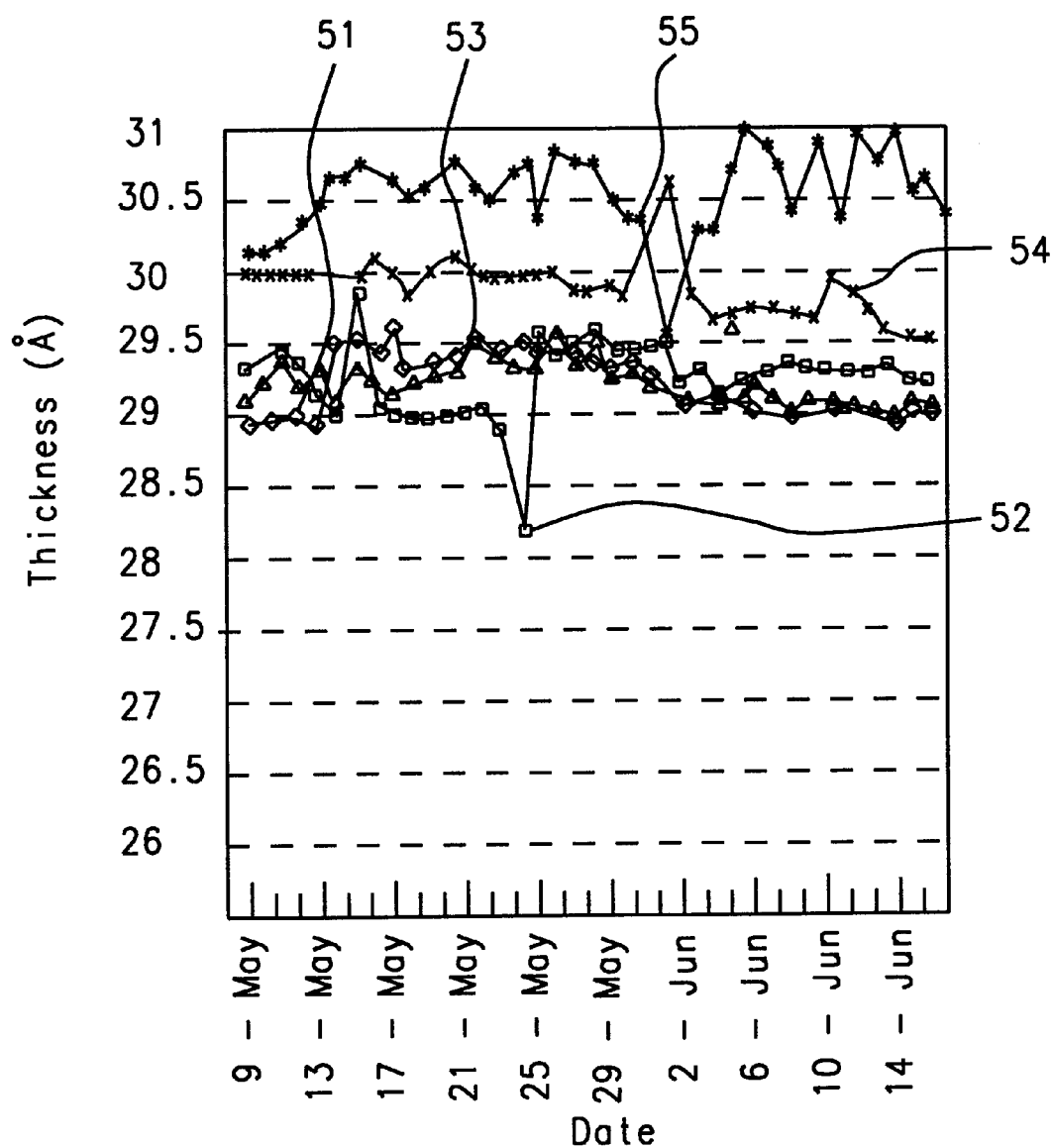
FIG. 5 is a plot of the variation in the thickness of a series of reference films, prepared according to the present invention.

The final structure is as shown in FIG. 4. We have found that with this arrangement the thickness of layer 2 is stable over a long period (after an initial settling down period). The effectiveness of this approach is illustrated in FIG. 5 which is a plot of thickness measured over period of approximately one month. The measured standard deviations for the various curves are summarized in TABLE III below:

TABLE III

| CURVE # | Standard Deviation |
|---|---|
| 51 | 0.2366 |
| 52 | 0.3716 |
| 53 | 0.0954 |
| 54 | 0.2354 |
| 55 | 0.2619 |

A comparison with the data seen in TABLE II, shows that a reference wafer prepared according to the teachings of the present invention is significantly more stable with respect to thickness over time than a wafer of the prior art. While the unprotected wafer had an average standard deviation of around 0.20 the reference film that was manufactured according to the teachings of the present invention had an average standard deviation of around 0.10, which is a significant improvement, indicating both less long term drift and, particularly, less random fluctuation from day to day.

While the invention has been particularly shown and described with reference to the preferred embodiments thereof, it will be understood by those skilled in the art that various changes in form and details may be made without departing from the spirit and scope of the invention.

What is claimed is:

1. A process for forming a stable oxide reference standard, comprising:
   providing a silicon wafer having a surface;
   polishing the surface until it has a micro-roughness that is less than about 2 Angstroms;
   under vacuum, cleaning said surface so that it is free of all contamination;
   growing a layer of silicon oxide on said contamination free surface; and
   then growing a layer of silicon nitride on said layer of silicon oxide, whereby said stable oxide reference standard is formed.

2. The process of claim 1 wherein forming a surface under vacuum further comprises providing an atmosphere whose pressure is less than about 760 torr.

3. The process of claim 1 wherein the step of growing a layer of silicon oxide further comprises wet oxidation at a temperature between about 750 and 850° C. for between about 7 and 9 minutes.

4. The process of claim 1 wherein said layer of silicon oxide has a thickness between about 25 and 30 Angstroms.

5. The process of claim 1 wherein the step of growing a layer of silicon nitride further comprises heating in a mixture of dichlorosilane and ammonia at a temperature between about 600 and 700° C. for between about 35 and 45 minutes.

6. The process of claim 1 wherein said layer of silicon nitride has a thickness between about 50 and 55 Angstroms.

7. The process of claim 1 further comprising, making ellipsometry measurements on an oxide film of unknown thickness and on the reference standard and, by comparing said measurements, determining a thickness value for said oxide film.

8. The process of claim 7 wherein said oxide film is a gate oxide whose thickness is to be measured during manufacture of field effect transistors.

* * * * *